(12) United States Patent
Chen et al.

(10) Patent No.: US 11,647,836 B2
(45) Date of Patent: May 16, 2023

(54) SLIDE RAIL KIT

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Tzu-Cheng Weng, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 242 days.

(21) Appl. No.: 17/195,500

(22) Filed: Mar. 8, 2021

(65) Prior Publication Data

US 2022/0087421 A1 Mar. 24, 2022

(30) Foreign Application Priority Data

Sep. 24, 2020 (TW) .................................. 109133460

(51) Int. Cl.
*A47B 96/07* (2006.01)
*A47B 57/32* (2006.01)
*A47B 96/14* (2006.01)
*H05K 7/18* (2006.01)

(52) U.S. Cl.
CPC .............. *A47B 96/07* (2013.01); *A47B 57/32* (2013.01); *A47B 96/1408* (2013.01); *H05K 7/183* (2013.01)

(58) Field of Classification Search
CPC ...... H05K 7/183; H05K 7/1489; A47B 57/32; A47B 57/50; A47B 88/43
See application file for complete search history.

(56) References Cited

U.S. PATENT DOCUMENTS

| 3,303,937 | A | * | 2/1967 | Mcconnell | ............. | A47B 57/50 |
| | | | | | | 211/187 |
| 3,612,290 | A | * | 10/1971 | Evans | ................... | A47B 57/50 |
| | | | | | | 211/187 |
| 3,986,318 | A | * | 10/1976 | McConnell | ............. | F16B 12/34 |
| | | | | | | 403/384 |

(Continued)

FOREIGN PATENT DOCUMENTS

| EP | 3 193 569 A1 | 7/2017 |
| JP | 2017-124155 A | 7/2017 |

(Continued)

*Primary Examiner* — Patrick D Hawn
(74) *Attorney, Agent, or Firm* — Winston Hsu

(57) ABSTRACT

A slide rail kit is applicable to a rack. The rack includes at least one mounting structure having a first predetermined portion and a second predetermined portion. The slide rail kit includes a rail member and a supporting bracket. The supporting bracket is arranged on the rail member and includes a first mounting feature and a second mounting feature. The first mounting feature is configured to be mounted to the first predetermined portion of the rack. The second mounting feature includes an elastic member and a mounting member arranged on the elastic member. The mounting member can be mounted to the second predetermined portion of the rack in response to an elastic force of the elastic member.

15 Claims, 12 Drawing Sheets

(56) References Cited

U.S. PATENT DOCUMENTS

| | | | |
|---|---|---|---|
| 5,571,256 A | 11/1996 | Good | |
| 6,021,909 A * | 2/2000 | Tang | H05K 7/1421 |
| | | | 211/183 |
| 6,070,957 A * | 6/2000 | Zachrai | H02B 1/32 |
| | | | 312/265.2 |
| 6,230,910 B1 * | 5/2001 | Olsson | A47B 57/50 |
| | | | 248/221.11 |
| 6,241,109 B1 * | 6/2001 | Kautz | A47B 57/50 |
| | | | 403/329 |
| 6,863,188 B2 * | 3/2005 | Besserer | H02B 1/34 |
| | | | 211/183 |
| 7,494,101 B2 * | 2/2009 | Chen | A47B 88/43 |
| | | | 312/265.2 |
| 8,262,041 B2 * | 9/2012 | Bergesch | H05K 7/183 |
| | | | 312/265.6 |
| 8,672,150 B2 * | 3/2014 | Chen | A47B 57/50 |
| | | | 211/187 |
| 9,629,276 B2 * | 4/2017 | Sampath | H05K 7/1489 |
| 9,861,193 B2 | 1/2018 | Chen | |
| 10,034,406 B2 | 7/2018 | Chapel | |
| 10,314,394 B2 | 6/2019 | Chen | |
| 10,455,725 B1 | 10/2019 | Hsu | |
| 10,736,420 B2 | 8/2020 | Chen | |
| 11,213,123 B2 * | 1/2022 | Chen | A47B 88/43 |
| 2007/0039913 A1 | 2/2007 | Chen | |
| 2014/0363108 A1 | 12/2014 | Chen | |
| 2017/0164507 A1 | 6/2017 | Liao | |
| 2018/0084907 A1 * | 3/2018 | Chen | A47B 96/07 |

FOREIGN PATENT DOCUMENTS

| | | |
|---|---|---|
| JP | 2018-50023 A | 3/2018 |
| JP | 2020-78540 A | 5/2020 |

* cited by examiner

SLIDE RAIL KIT

BACKGROUND OF THE INVENTION

1. Field of the Invention

The present invention relates to a slide rail, and more particularly, to a slide rail kit applicable to a rack.

2. Description of the Prior Art

In general, a carried object (such as an electronic apparatus) usually can be mounted to a rack through at least a slide rail in a rack system. The rack has a plurality of posts, and depending on the specifications or types of the rack, the posts will have many different mounting features, in order to mount a plurality of mounting portions of a slide rail. The mounting feature and the mounting portion usually require tools (such as screws) to mount the at least one slide rail to the rack.

However, with the diversification of market requirements, how to develop slide rail product that facilitates the mutual installation or removal of slide rails and racks has become an issue.

SUMMARY OF THE INVENTION

The present invention relates to a slide rail kit applicable to a rack.

According to an aspect of the present invention, a slide rail kit comprises a slide rail kit applicable to a rack. The rack comprises at least one mounting structure. The at least one mounting structure has a first predetermined portion and a second predetermined portion. The slide rail kit comprises a rail member and a supporting bracket. The supporting bracket is arranged on the rail member. The rail member comprises a first mounting feature and a second mounting feature. The first mounting feature is configured to be mounted to the first predetermined portion of the rack. The second mounting feature comprises an elastic member and a mounting member. The mounting member is arranged on the elastic member, and the mounting member is configured to be mounted to the second predetermined portion of the rack in response to an elastic force of the elastic member.

Preferably, the at least one mounting structure of the rack comprising a plurality of holes, each hole is defined by a plurality of walls. The plurality of walls comprises at least a front wall and a rear wall, the front wall is the first predetermined portion. The rear wall is the second predetermined portion.

Preferably, the plurality of holes comprises at least a first hole and a second hole. The rail member is able to be engaged with the front wall of the first hole through the first mounting feature of the supporting bracket, and the rail member is able to be engaged with the rear wall of the second hole through the second mounting feature of the supporting bracket.

Preferably, the first mounting feature of the supporting bracket has a first section and a second section. The second section is bend relative to the first section. The first section is configured to be engaged with the front wall of the first hole.

Preferably, the plurality of walls further comprises an upper wall and a lower wall respectively located above and below the first section.

Preferably, the rack has a connecting feature, the supporting bracket further has a connecting structure, and the connecting structure is configured to provide a fastening member for being locked to the connecting feature of the rack.

Preferably, the supporting bracket comprises a longitudinal portion and a protruded portion having a transverse height relative to the longitudinal portion. The supporting bracket is connected to the rail member through the longitudinal portion. The first mounting feature and the second mounting feature are arranged on the protruded portion.

Preferably, the slide rail kit further comprises at least one movable rail movable relative to the rail member.

According to another aspect of the present invention, a slide rail kit is applicable to a rack. The rack comprises a first hole and a second hole. The slide rail kit comprises a rail member and a supporting bracket. The supporting bracket is arranged on the rail member. The supporting bracket comprises a first mounting feature and a second mounting feature respectively configured to be mounted to a first predetermined portion of the first hole and a second predetermined portion of the second hole of the rack, to prevent the rail member from being moved longitudinally relative to the rack. The second mounting feature comprises an elastic member and amounting member, the mounting member is arranged on the elastic member, and the mounting member is configured to be mounted to the second predetermined portion of the rack.

Preferably, the elastic member comprises a connecting portion, an operated portion and an elastic arm located between the connecting portion and the operated portion. The connecting portion is connected to the supporting bracket, and the mounting member is arranged on the elastic arm, such that the mounting member is able to be engaged with the second predetermined portion of the rack in response to an elastic force of the elastic member.

According to yet another aspect of the present invention, a slide rail kit is applicable to a rack, the rack comprising at least one rack. The at least one rack has a first hole, a second hole, a first post side and a second post side opposite to the first post side. The first hole has a first predetermined portion. The second hole has a second predetermined portion. The slide rail kit comprises a rail member, a supporting bracket, a first mounting feature and a second mounting feature. The supporting bracket is arranged on the rail member. The first mounting feature is arranged on the supporting bracket. The first mounting feature has a first section. The first section extends transversally from the supporting bracket. The second mounting feature comprises an elastic member and a mounting member. The elastic member is elastically connected to the supporting bracket. The mounting member is arranged on the elastic member. When the rail member is located on a first position relative to the at least one post of the rack, the first mounting feature penetrates through the first hole, and the mounting member of the second mounting feature abuts against the first post side of the at least one post, such that the elastic member is deformed elastically. When the rail member is located on a second position relative to the at least one post of the rack, the first section of the first mounting feature abuts against the first predetermined portion of the first hole, and the mounting member penetrates through the second hole in response to an elastic force of the elastic member, and the mounting member abuts against the second predetermined portion of the second hole.

Preferably, the mounting member comprises a head portion, a neck portion and a body portion, the neck portion is connected to the head portion and the body portion, a size of the head portion is greater than a size of the neck portion, a size of the body portion is greater than the size of the neck portion, such that an engaging slot is formed between the head portion, the neck portion and the body portion, the elastic member has a key hole, and the key hole has an entrance portion and a blocking portion communicating with the entrance portion, the neck portion and the body portion of the mounting member are able to penetrate through the entrance portion, when the mounting member is moved to the blocking portion, an inner wall of the blocking portion is able to be engaged with the engaging slot form between the head portion, the neck portion and the body portion of the mounting member.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3A is an enlarge view of a part of FIG. 3.

DETAILED DESCRIPTION

Figure 1:
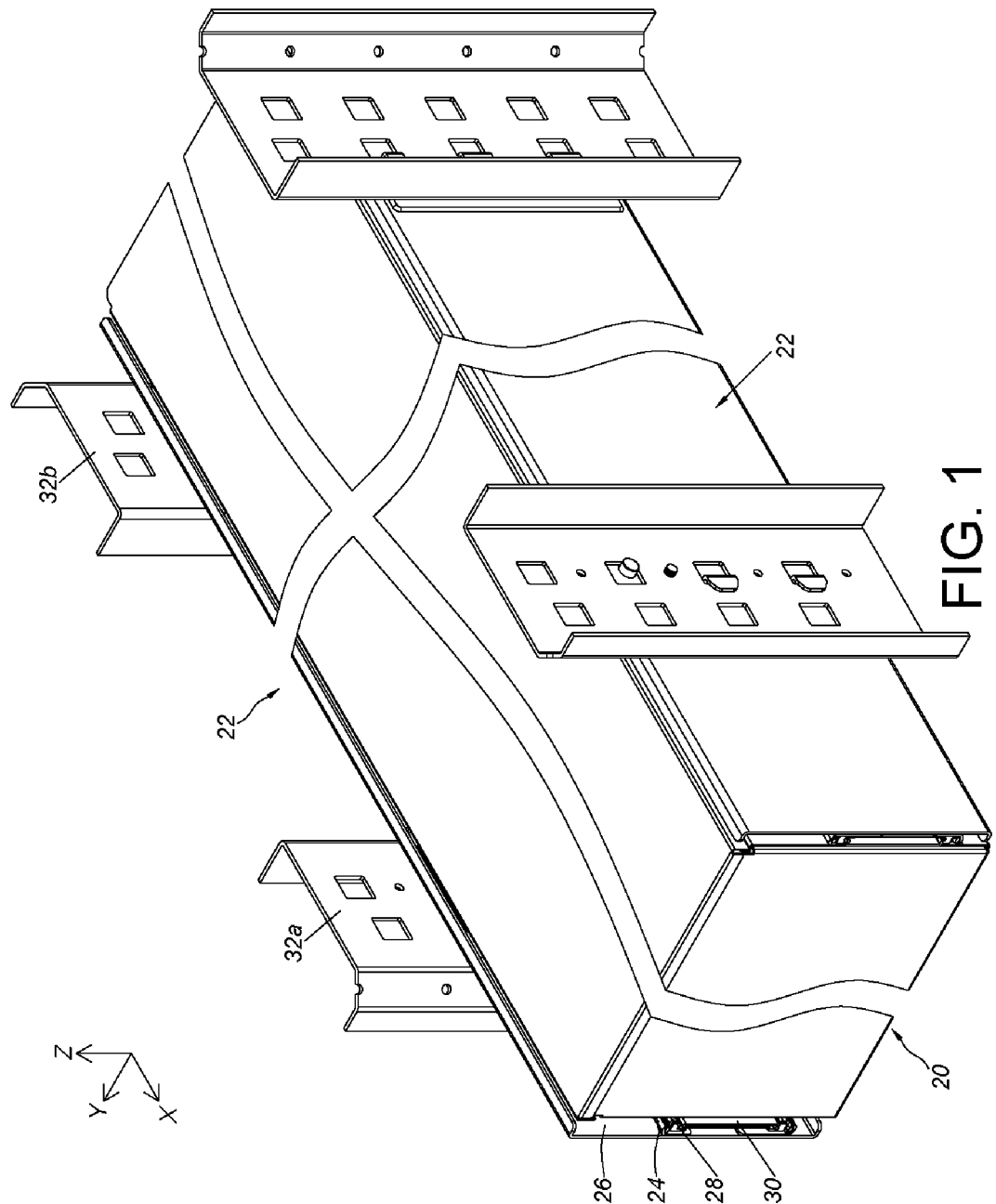
FIG. 1 is a diagram illustrating a carried object mounted to a rack through a pair of slide rail kits according to an embodiment of the present invention.
Figure 2:
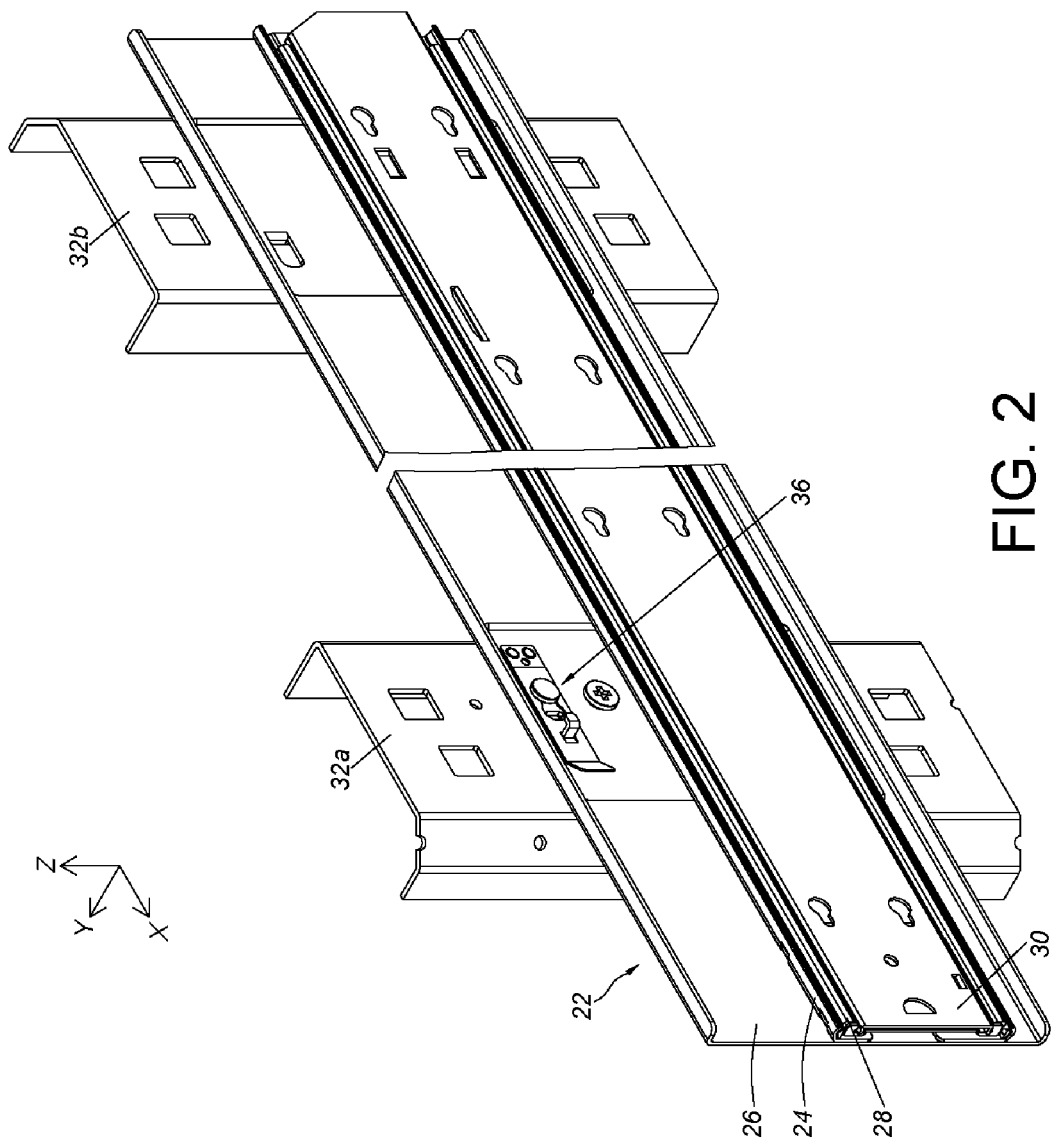
FIG. 2 is a diagram illustrating one slide rail kit mounted to the rack according to an embodiment of the present invention.

As shown in FIG. 1 in conjunction with FIG. 2, a carried object 20 of an embodiment of the present invention may be mounted to a rack through a pair of slide rail kits 22. Furthermore, each slide rail kit 22 comprises a rail member 24 and a supporting bracket 26. Preferably, the slide rail kit 22 further comprises at least one movable rail movable relative to the rail member 24. In the present embodiment, a first movable rail 28 and a second movable rail 30 are used as two movable rails. The first movable rail 28 (e.g., a middle rail) is movably mounted between the rail member 24 (e.g., an outer rail) and the second movable rail 30 (e.g., an inner rail). The rail member 24, the first movable rail 28 and the second movable rail 30 can be longitudinally moved relative to each other. Wherein, the rail member 24 is mounted to at least one post (such as a first post 32a and a second post 32b) of the rack through the supporting bracket 26. On the other hand, the second movable rail 30 can be used to carry the carried object 20. It is noticed that in the present embodiment, the X-axis direction is the longitudinal direction (or the length direction of the slide rail), the Y-axis direction is the transversal direction (or the lateral direction of the slide rail), and the Z-axis direction is the perpendicular direction (or the height direction of the slide rail).

Figure 3:
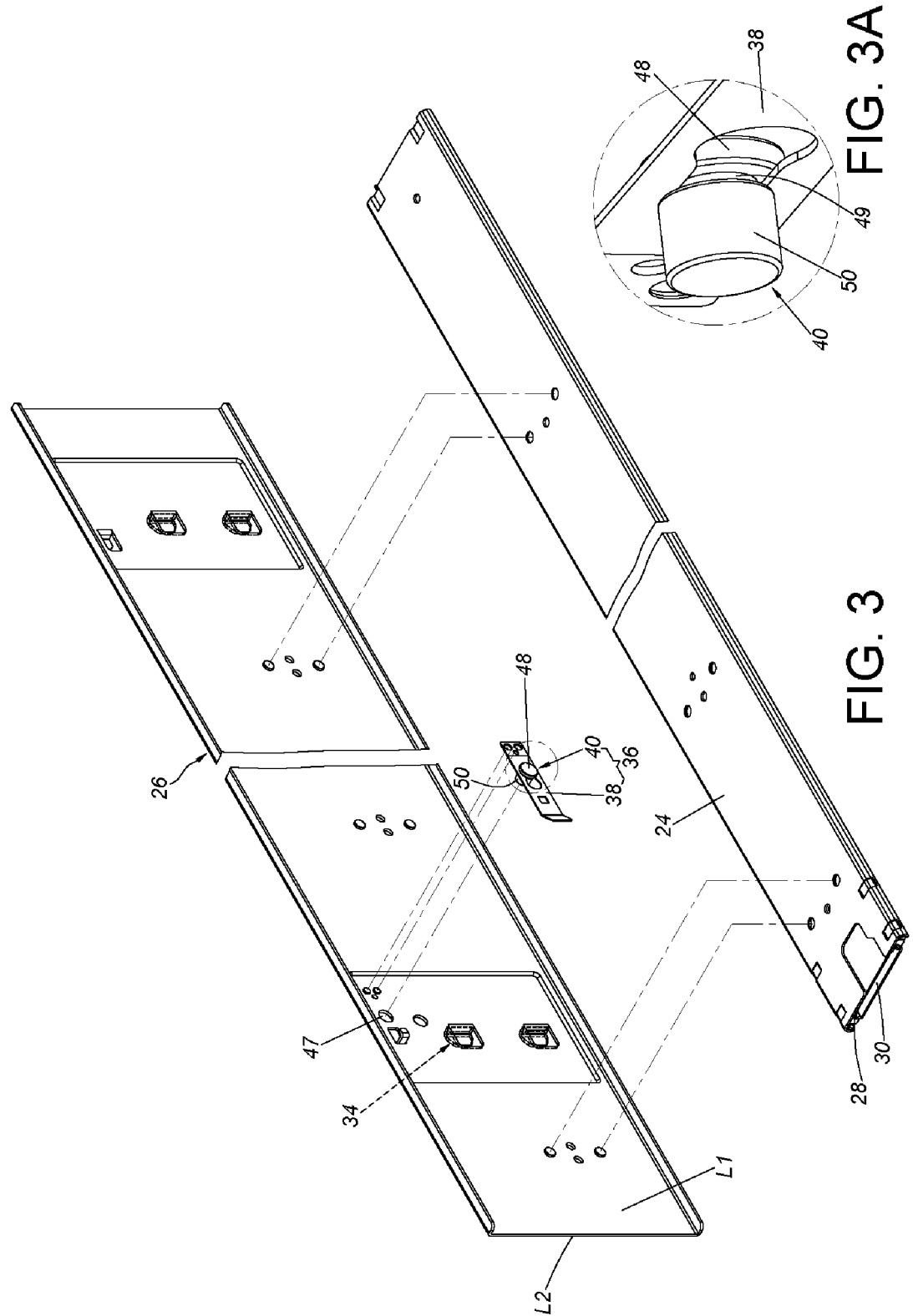
FIG. 3 is an exploded view illustrating the slide rail kit according to an embodiment of the present invention.
Figure 4:
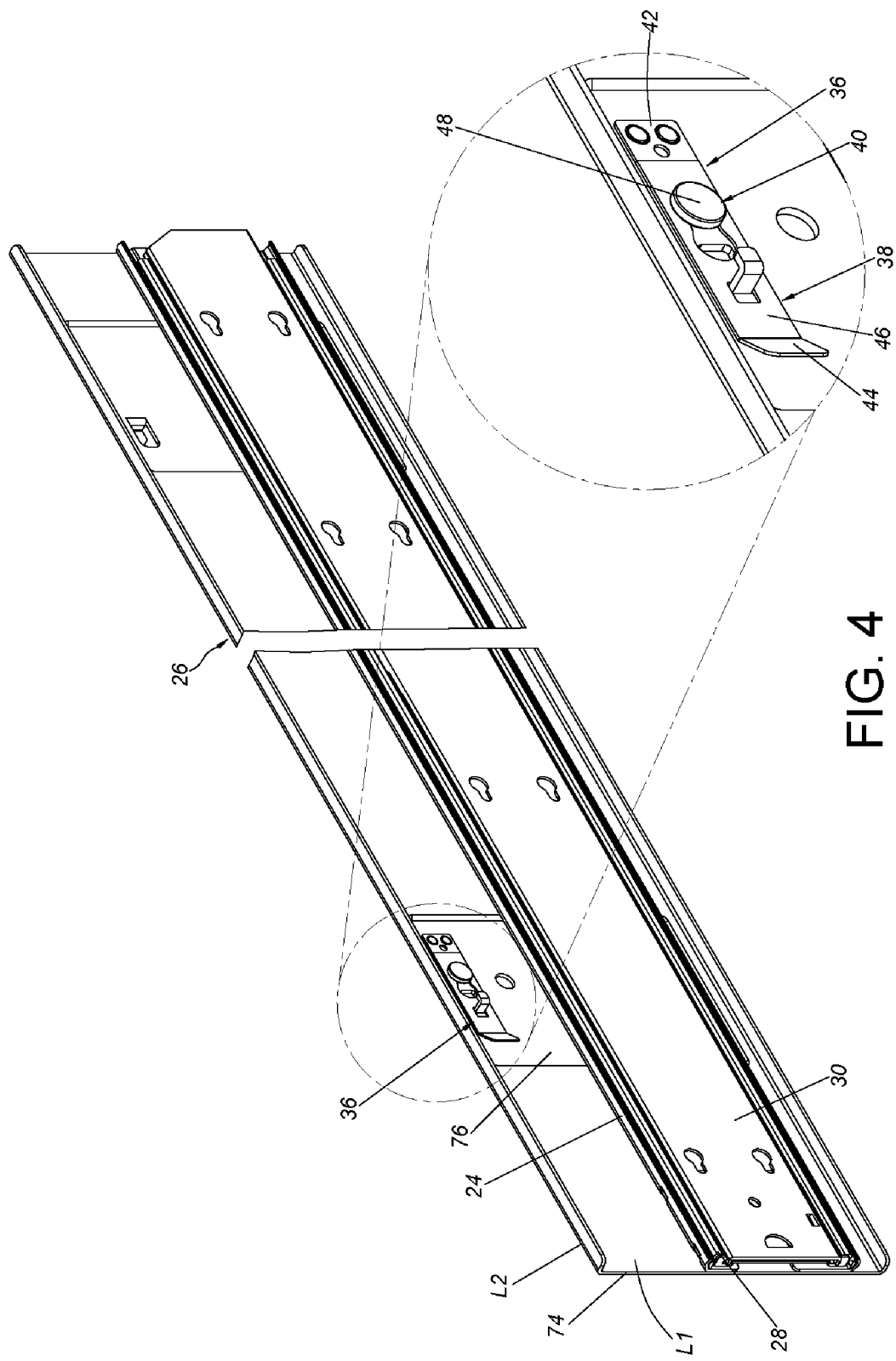
FIG. 4 is a diagram illustrating the slide rail kit in an angle of view according to an embodiment of the present invention.
Figure 5:
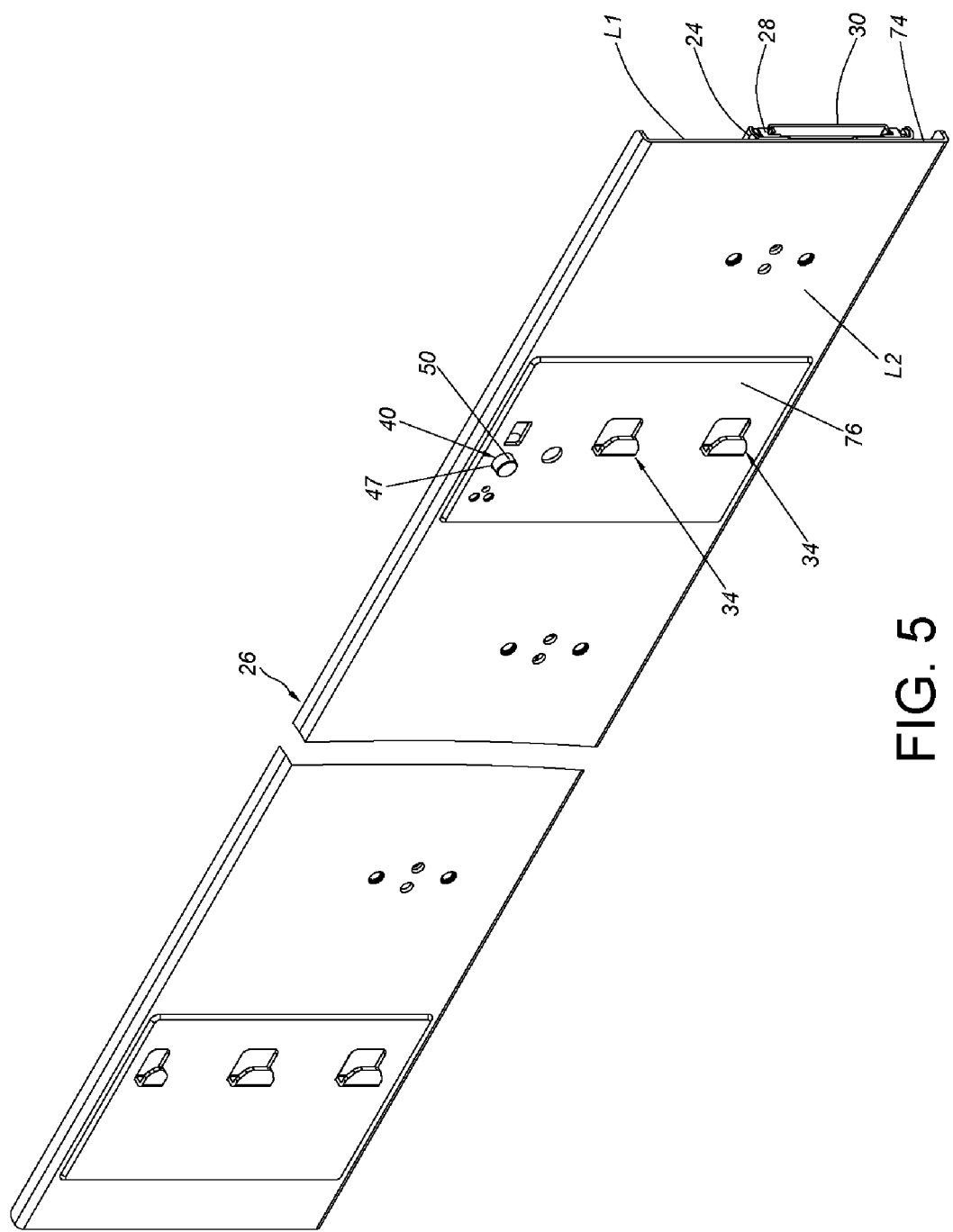
FIG. 5 is a diagram illustrating the slide rail kit in another angle of view according to an embodiment of the present invention.

As shown in FIG. 3, FIG. 4 and FIG. 5, the supporting bracket 26 is arranged on the rail member 24. In the present embodiment, the supporting bracket 26 is fixedly arranged on back side of the rail member 24, and the supporting bracket 26 can be regarded as a part of the rail member 24. In other alternative embodiment, the supporting bracket 26 can be integrated with the rail member 24, so the present invention is not limited thereto. The supporting bracket 26 has a first side L1 and a second side L2 opposite to the first side L1 in position. The supporting bracket 26 comprises a first mounting feature 34 and a second mounting feature 36. Wherein, the second mounting feature 36 comprises an elastic member 38 and a mounting member 40, and the mounting member 40 is arranged on the elastic member 38.

Preferably, the elastic member 38 is a spring plate, and the elastic member 38 includes a connecting portion 42, an operating portion 44, and an elastic arm 46 located between the connecting portion 42 and the operating portion 44 (as shown in FIG. 4), the connecting portion 42 is connected (such as fixedly connected, but not limited) to the first side L1 of the supporting bracket 26. The mounting member 40 is arranged on the elastic arm 46, and the operating portion 44 is tilted at a predetermined angle relative to the elastic arm 46 to facilitate user operation.

Preferably, the supporting bracket 26 has a space 47 connecting the first side L1 and the second side L2 of the supporting bracket 26. The space 47 can be a hole or a gap. In the present embodiment, the space 47 is a hole, but the implementation is not limited. On the other hand, the mounting member 40 has a head portion 48 and a body portion 50 connected to the head portion 48. A size of the head portion 48 is greater than a size of the body portion 50, and the head portion 48 is blocked on one side of the elastic arm 46 of the elastic member 38. The body 50 can penetrate through the space 47 to pass from the first side L1 to the second side L2 of the supporting bracket 26 (as shown in FIG. 5). In addition, the first mounting feature 34 is arranged on the second side L2 of the supporting bracket 26 (as shown in FIG. 5).

Preferably, the first mounting feature 34 and (the mounting member 40 of) the second mounting feature 36 are arranged on two positions of different heights of the supporting bracket 26 (as shown in FIG. 5).

Figure 6:
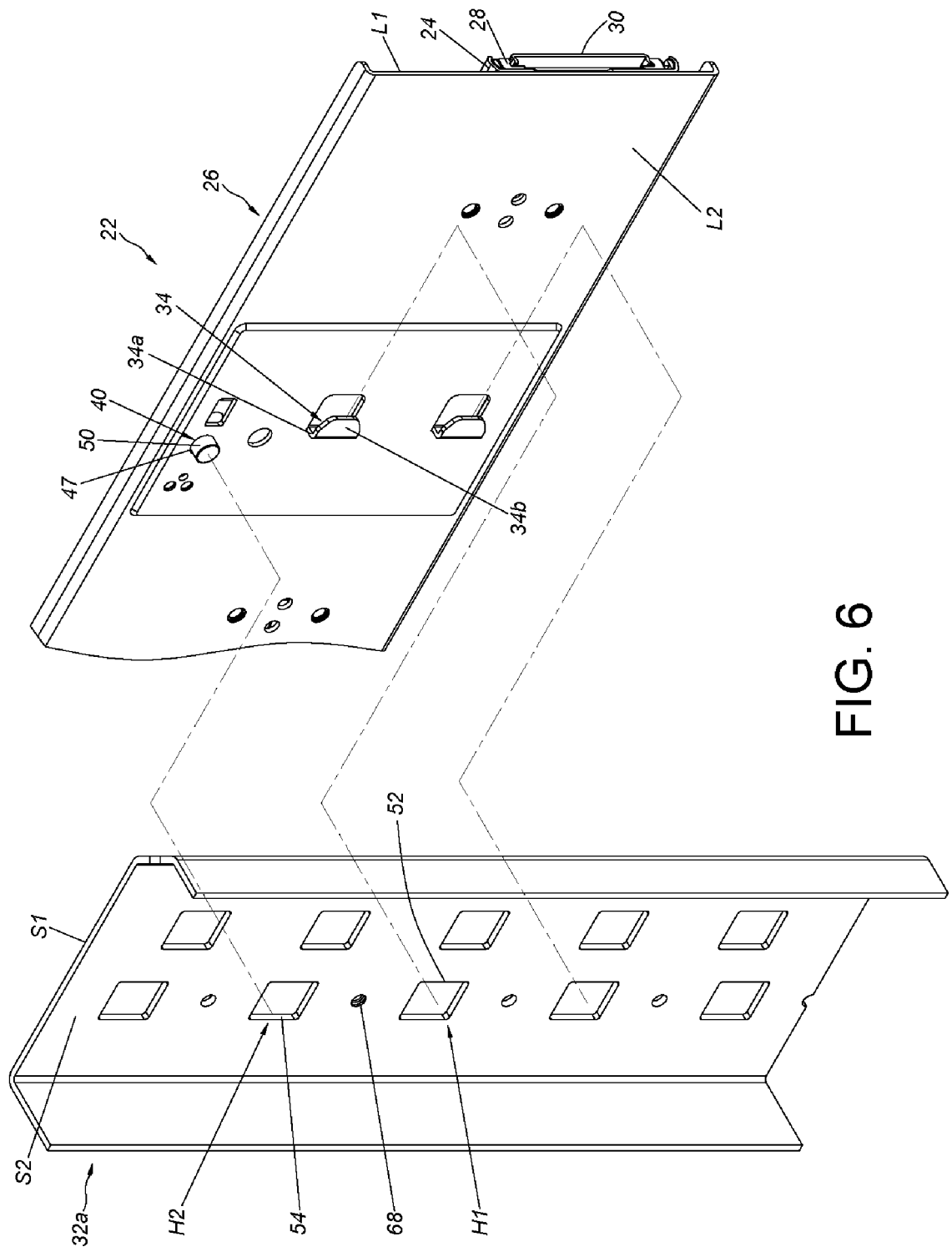
FIG. 6 is an exploded view illustrating the slide rail kit and the rack according to an embodiment of the present invention.

As shown in FIG. 6, the post, such as the first post 32a, of the rack comprises at least one mounting structure. The at least one mounting structure has a first predetermined portion 52 and a second predetermined portion 54.

Preferably, the at least one mounting structure includes a plurality of holes. A predetermined distance is formed between the holes, and the holes are arranged on positions of different heights of the first post 32a relative to each other. In the present embodiment, a first hole H1 and a second hole H2 are taken as an example to illustrate. Each hole H1, H2 communicates with a first post side S1 and a second post side S2 of the first post 32a.

Preferably, each hole H1, H2 is defined by a plurality of walls. For example, the first hole H1 and the second hole H2 are respectively defined by a front wall, a rear wall, an upper wall and a lower wall. In the present embodiment, the front wall of the first hole H1 is used as the first predetermined portion 52, and the rear wall of the second hole H2 is used as the second predetermined portion 54, but the implementation is not limited.

Preferably, the first mounting feature 34 of the supporting bracket 26 has a first section 34a and a second section 34b. The first section 34a extends transversally (or laterally) from the second side L2 of the supporting bracket 26 for a predetermined distance. The second section 34b is bent relative to the first section 34a. For example, the second section 34b is bent substantially perpendicularly relative to the first section 34a.

Figure 7:
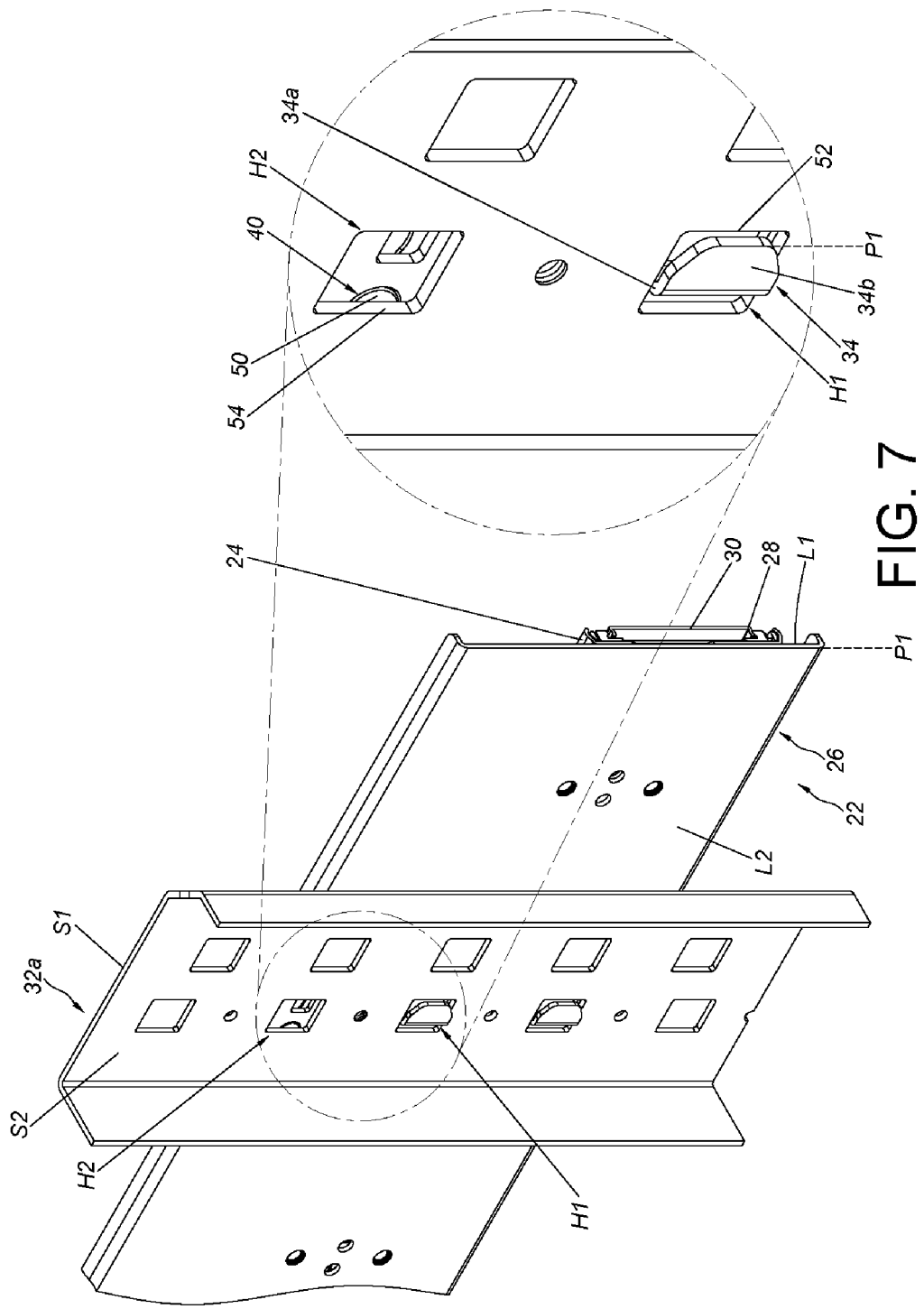
FIG. 7 is a diagram illustrating a mounting process of the slide rail kit and the rack in an angle of view according to an embodiment of the present invention.
Figure 8:
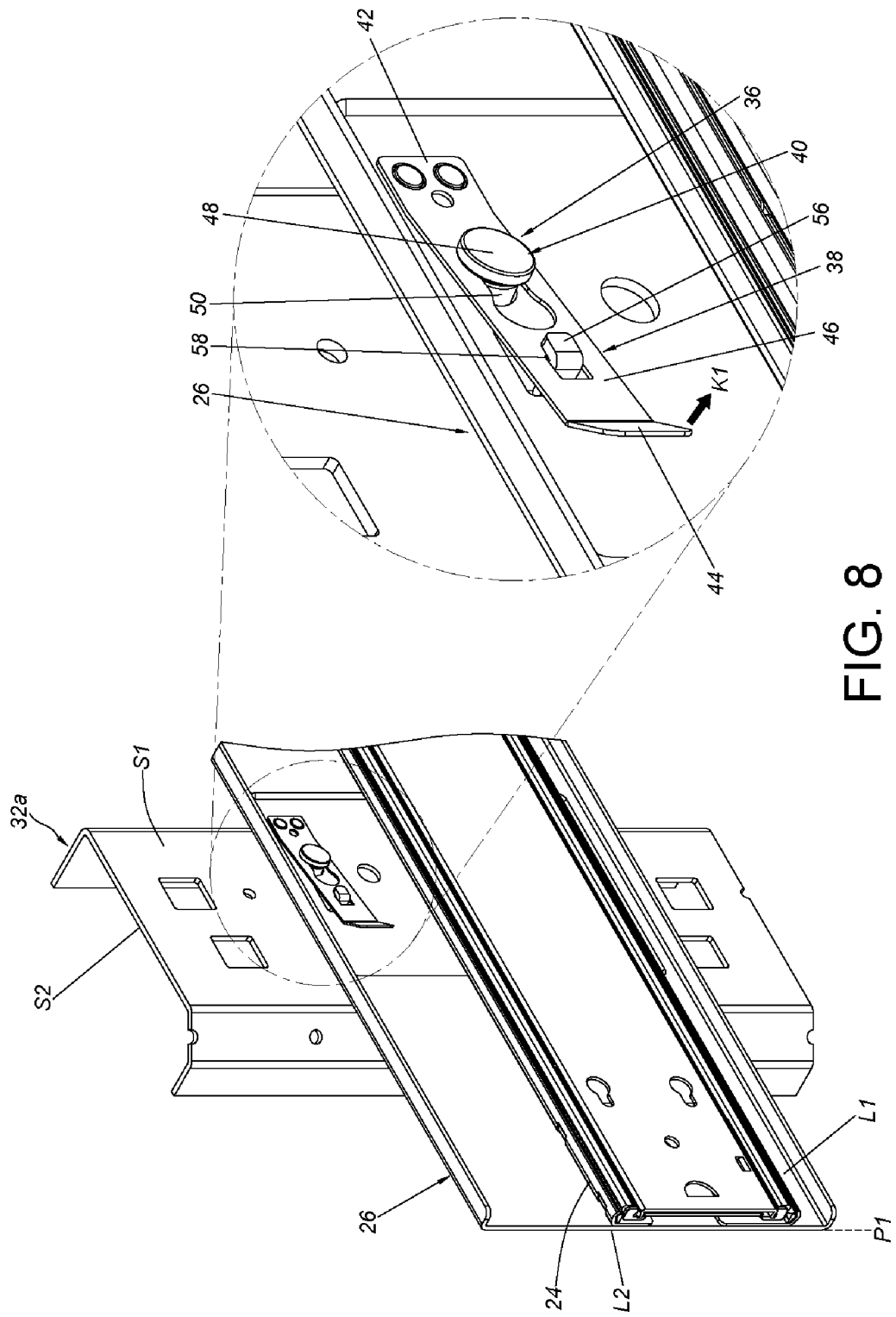
FIG. 8 is a diagram illustrating the mounting process of the slide rail kit and the rack in another angle of view according to an embodiment of the present invention.

As shown in FIG. 7 in conjunction with FIG. 8, the rail member 24 is mounted to the post of the rack through the supporting bracket 26. Furthermore, when the rail member 24 is located at a first position P1 relative to the first post 32a of the rack, the first mounting feature 34 of the supporting bracket 26 can penetrate through the first hole H1 to pass from the first post side S1 to the second post side S2 of the first post 32a (as shown in FIG. 7). On the other hand, the body portion 50 of the mounting member 40 of the second mounting feature 36 abuts against the first post side S1 of the first post 32a (as shown in FIG. 7), such that the elastic arm 46 of the elastic member 38 is moved to a first lateral direction K1 and accumulates an elastic force in a second lateral direction opposite to the first lateral direction K1 (as shown in FIG. 8). Preferably, the supporting bracket 26 has a limiting portion 56, and the elastic arm 46 of the elastic member 38 has a corresponding feature 58 to correspond with the limiting portion 56, such that when the elastic arm 46 of the elastic member 38 is moved along the first lateral direction K1, the corresponding feature 58 and the limiting portion 56 block each other to prevent the elastic arm 46 of the elastic member 38 from being excessively moved along the first lateral direction K1 (as shown in FIG. 8).

Figure 9:
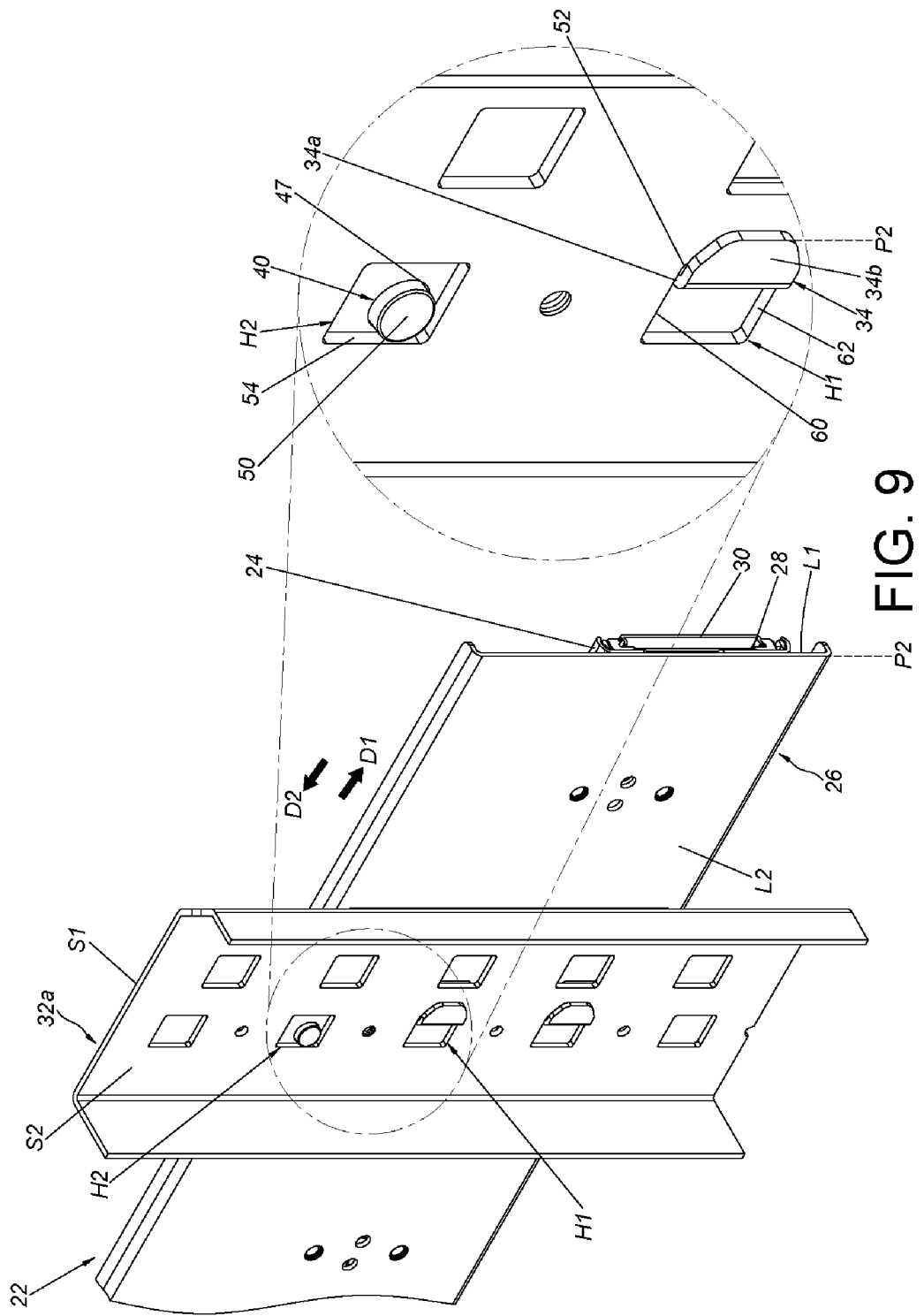
FIG. 9 is a diagram illustrating the slide rail kit being mounted to the rack in an angle of view according to an embodiment of the present invention.
Figure 10:
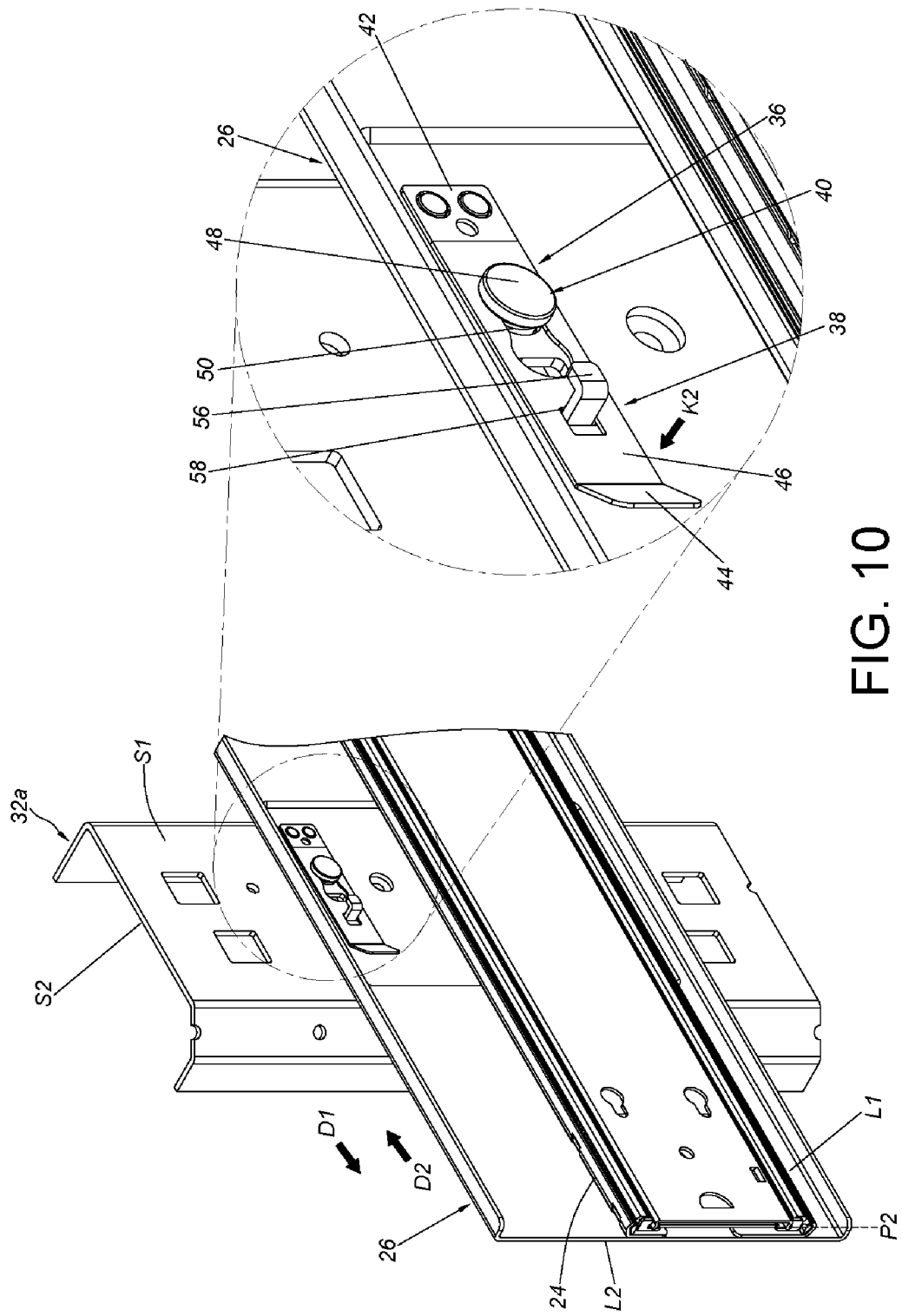
FIG. 10 is a diagram illustrating the slide rail kit being mounted to the rack in another angle of view according to an embodiment of the present invention.

As shown in FIG. 9 in conjunction with FIG. 10, when the rail member 24 is moved from the first position P1 along a first predetermined direction D1 (such as front direction, but not limited to) to a second position P2 relative to the first post 32a of the rack, the first mounting feature 34 is configured to be mounted to the first predetermined portion 52 of the rack, and the mounting member 40 is able to be mounted to the second predetermined portion 54 of the rack in response to the elastic force of the elastic member 38, in order to prevent the rail member 24 from being moved freely relative to the rack.

Specifically, when the rail member 24 is located at the second position P2 relative to the first post 32a of the rack, the first section 34a of the first mounting feature 34 of the supporting bracket 26 is able to be engaged with the front wall of the first hole H1 (that is, the first predetermined portion 52), in order to prevent the rail member 24 from being moved relative to the rack along the first predetermined direction D1 from the second position P2 (as shown in FIG. 9). On the other hand, when the rail member 24 is located at the second position P2 relative to the first post 32a of the rack, since the body portion 50 of the mounting member 40 of the second mounting feature 36 corresponds to the second hole H2, the elastic arm 46 of the elastic member 38 releases the elastic force along the second lateral direction K2 (as shown in FIG. 10), such that the body portion 50 of the mounting member 40 can be engaged with the rear wall in the second hole H2 of the first post 32a (that is, the second predetermined portion 54, as shown in FIG. 9) in response to the elastic force of the elastic arm 46 along the second lateral direction K2, to prevent the rail member 24 from being moved relative to the rack from the second position P2 along a second predetermined direction D2 (such as rearward direction, but not limited to). Wherein, the second predetermined direction D2 and the first predetermined direction D1 are opposite directions.

Preferably, when the rail member 24 is located at the second position P2 relative to the first post 32a of the rack, an upper wall 60 and a lower wall 62 of the first hole H1 are respectively located above and below the first section 34a of the first mounting feature 34, to prevent the rail member 24 from being moved upward or downward from the second position P2 relative to the rack (as shown in FIG. 9).

Preferably, when the rail member 24 is located at the second position P2 relative to the first post 32a of the rack, through the second section 34b of the first mounting feature 34 being adjacent to a lateral side of the first predetermined portion 52, rail member 24 is prevented from being moved transversely from the second position P2 relative to the rack (as shown in FIG. 9).

Figure 11:
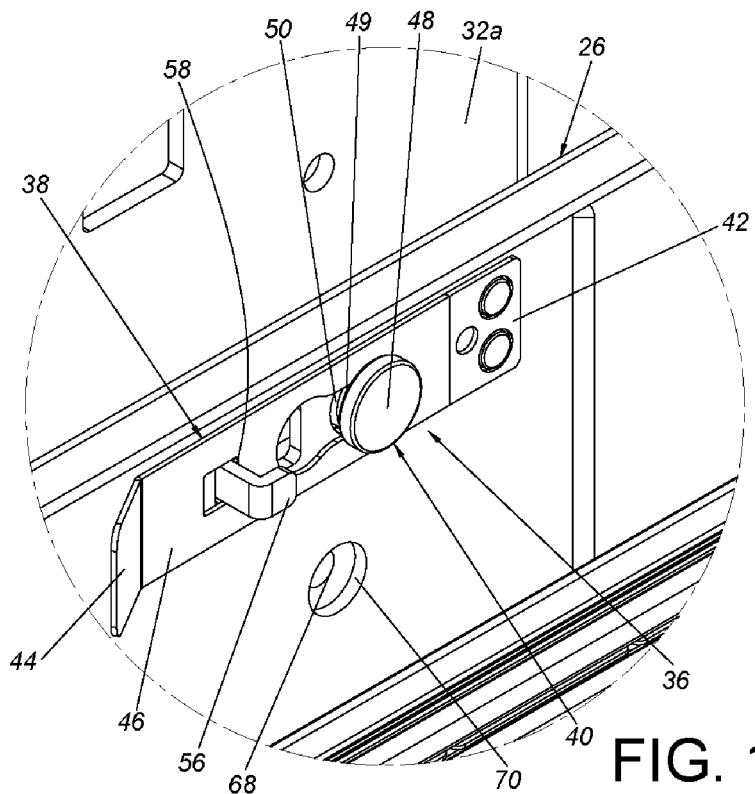
FIG. 11 is a diagram illustrating an elastic member of the slide rail kit being in a first state, such that a mounting member being located in a mounting position according to an embodiment of the present invention.
Figure 12:
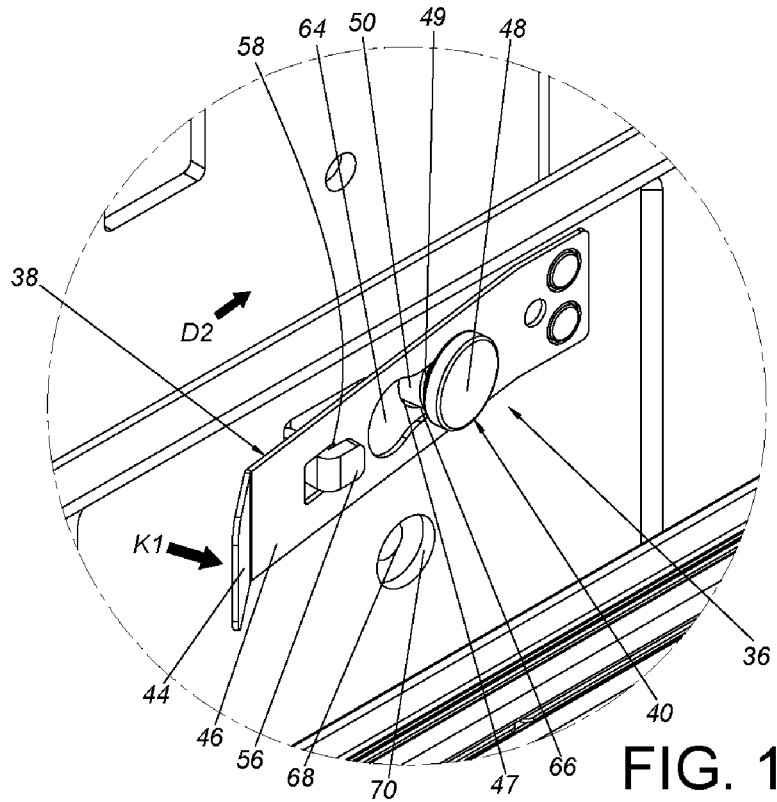
FIG. 12 is a diagram illustrating the elastic member of the slide rail kit being in a second state, such that a mounting member not being located in a mounting position according to an embodiment of the present invention.

As shown in FIG. 11 in conjunction with FIG. 12, when the rail member 24 at the second position P2 is to be unmounted from the first post 32a of the rack, an user can apply a force along the first lateral direction K1 to the operating portion 44 to drive the elastic arm 46, such that the body portion 50 of the mounting member 40 is no longer engaged with the rear wall of the second hole H2 (that is, no longer engaged with the second predetermined part 54), so that the rail member 24 can be returned to the first position P1 from the second position P2 along the second predetermined direction D2 and can be detached from the rack.

Please refer to FIG. 3 in conjunction with the diagram shown in FIG. 3A. FIG. 3A is an enlarge view of a part of FIG. 3. Preferably, the mounting member 40 further has a neck portion 49 connected between the head portion 48 and the body portion 50. A size of the body portion 50 is greater than the size of the neck portion 49, such that and the neck portion 49 is an engaging slot for example. On the other hand, the elastic arm 46 of the elastic member 38 has a key hole, and the key hole has an entrance portion 64 and a blocking portion 66 communicating with the entrance portion 64. A contour of the head portion 48 of the mounting member 40 is greater than a contour of the blocking portion 66 of the key hole. The neck portion 49 and the body portion 50 of the mounting member 40 can penetrate through the entrance portion 64, and the mounting member 40 can be moved to the blocking portion 66. Through an inner wall of the blocking portion 66 being engaged with the neck portion 49 of the mounting member 40, the mounting member 40 can be arranged on the elastic arm 46 of the elastic member 38. Preferably, through the mutual blocking between the corresponding feature 58 and the limiting portion 56, the elastic arm 46 of the elastic member 38 is prevented from being excessively moved in the first lateral direction K1, such that the body portion 50 of the mounting member 40 is not able to leave the space 47 along the first lateral direction K1 (as shown in FIG. 12).

Figure 13:
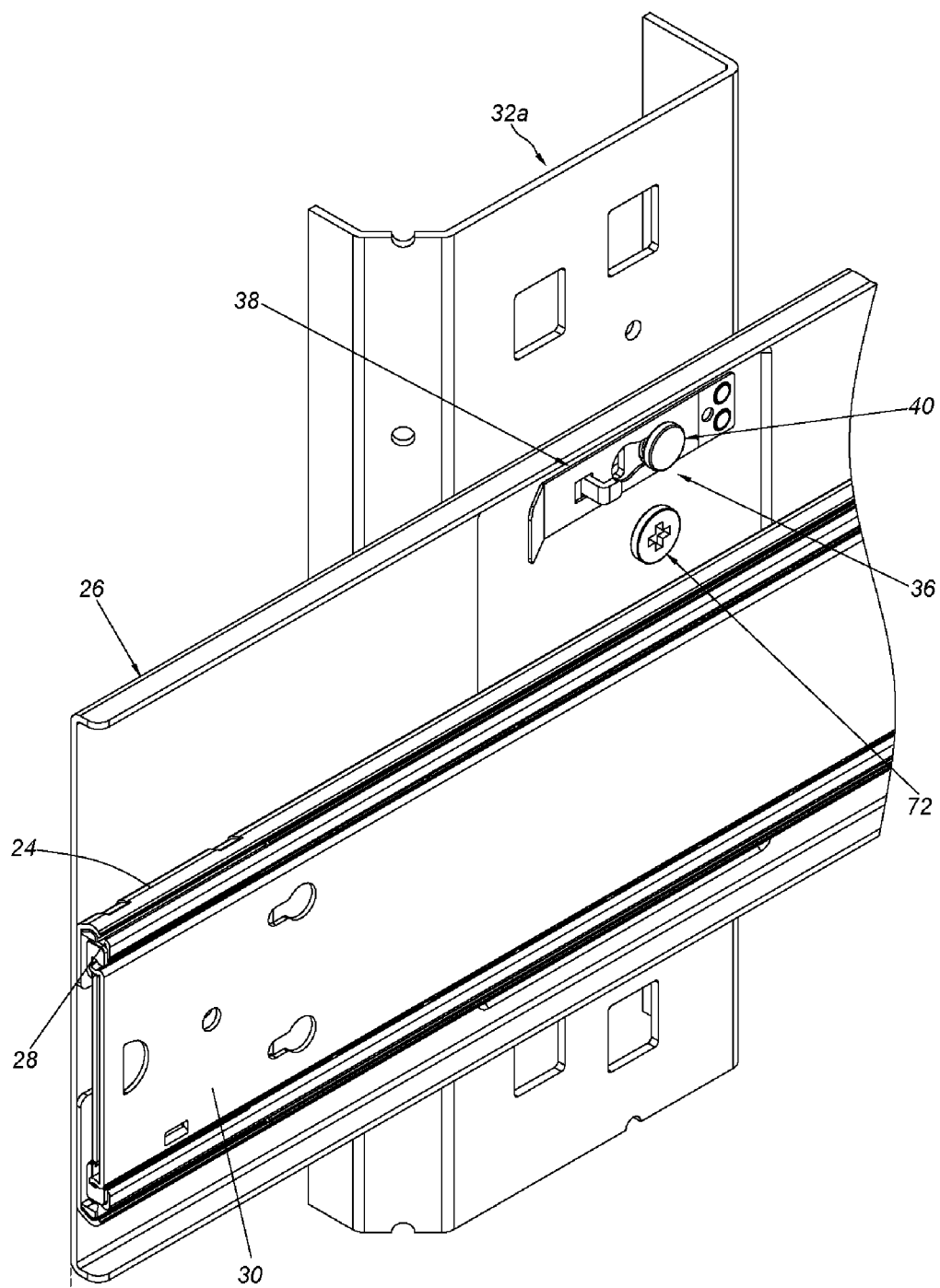
FIG. 13 is a diagram illustrating the slide rail kit being mounted to the rack through a fastening member according to an embodiment of the present invention.

As shown in FIG. 11 in conjunction with FIG. 13, the first post 32a of the rack has a connecting feature 68, and the supporting bracket 26 further has a connecting structure 70 (as shown in FIG. 11). The connecting feature 68 is, for example, a screw hole (this part can also refer to FIG. 6), and the connecting structure 70 is a mounting hole. When the rail member 24 is located at the second position P2 relative to the first post 32a of the rack, the connecting structure 70 is configured to provide a threaded portion of a fastening member 72 to penetrate and be fastened to the connecting feature 68 (as shown in FIG. 12), to lock the rail member 24 at the second position P2.

It is noticed that, as shown in FIG. 4 and FIG. 5, the supporting bracket 26 comprises a longitudinal portion 74 and a protruded portion 76. The protruded portion 76 has a transverse height relative to the longitudinal portion 74, and the supporting bracket 26 is connected to the rail member 24 through the longitudinal portion 74, and the first mounting feature 34 (as shown in FIG. 5) and the second mounting feature 36 (as shown in FIG. 4) are arranged on the protruded portion 76. Wherein, the thickness of the supporting bracket 26 can be increased by the protruded portion 76, which may improve the structural strength of the supporting bracket 26 (or the rail member 24).

Compared to the prior art, the slide rail kit 20 of the present embodiment has advantages over the prior art by the following perspectives:

1. The second mounting feature 36 comprises the elastic member 38 and the mounting member 40. The user can apply a force to the elastic member 38 such that the body portion 50 of the mounting member 40 is no longer engaged with the second predetermined portion 54 (such as the rear wall of the second hole H2) of the first post 32a, so that the rail member 24 can be returned from the second position P2 to the first position P1 and can be detached from the rack.

2. When the rail member 24 is mounted to the rack in the second position P2, except that it can be mounted to the first predetermined portion 52 and the second predetermined portion 54 of the rack through the first mounting feature 34 and the second mounting feature respectively, the rail member 24 (the supporting bracket 26) can also be locked to the rack through the fastening member 72 alternatively.

3. The supporting bracket 26 includes a longitudinal portion 74 and a protruded portion 76 having a transverse height relative to the longitudinal portion 74. Through the protruded portion 76, the thickness of the supporting bracket 26 can be increased, which may improve the structural strength of the supporting bracket 26 (or the rail member 24).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail kit, applicable to a rack, the rack comprising at least one mounting structure, the at least one mounting structure having a first predetermined portion and a second predetermined portion, the slide rail kit comprising:
   a rail member; and
   a supporting bracket arranged on the rail member, the supporting bracket comprising a first mounting feature and a second mounting feature, the first mounting feature configured to be mounted to the first predetermined portion of the rack;
   wherein the second mounting feature comprises an elastic member and a mounting member, the mounting member is arranged on the elastic member, and the mounting member is configured to be mounted to the second predetermined portion of the rack in response to an elastic force of the elastic member;
   wherein the mounting member comprises a head portion, a neck portion and a body portion, the neck portion is connected to the head portion and the body portion, a size of the head portion is greater than a size of the body portion, the size of the body portion is greater than a size of the neck portion, the neck portion is an engaging slot, the elastic member has a key hole, and the key hole has an entrance portion and a blocking portion communicating with the entrance portion, the neck portion and the body portion of the mounting member are able to penetrate through the entrance portion, when the mounting member is moved to the blocking portion, an inner wall of the blocking portion is able to be engaged with the engaging slot of the mounting member.

2. The slide rail kit of claim 1, wherein the at least one mounting structure of the rack comprising a plurality of holes, each hole is defined by a plurality of walls, the plurality of walls comprises at least a front wall and a rear wall, the front wall is the first predetermined portion, the rear wall is the second predetermined portion, the plurality of holes comprises at least a first hole and a second hole, the rail member is able to be engaged with the front wall of the first hole through the first mounting feature of the supporting bracket, and the rail member is able to be engaged with the rear wall of the second hole through the second mounting feature of the supporting bracket.

3. The slide rail kit of claim 2, wherein the first mounting feature of the supporting bracket has a first section and a second section, the second section is bent relative to the first section, the first section is configured to be engaged with the front wall of the first hole.

4. The slide rail kit of claim 3, wherein the plurality of walls further comprises an upper wall and a lower wall respectively located above and below the first section.

5. The slide rail kit of claim 1, wherein the rack has a connecting feature, the supporting bracket further has a connecting structure, and the connecting structure is configured to provide a fastening member for being locked to the connecting feature of the rack.

6. The slide rail kit of claim 1, wherein the supporting bracket comprises a longitudinal portion and a protruded portion having a transverse height relative to the longitudinal portion, the supporting bracket is connected to the rail member through the longitudinal portion, the first mounting feature and the second mounting feature are arranged on the protruded portion.

7. The slide rail kit of claim 1, further comprising at least one movable rail movable relative to the rail member.

8. A slide rail kit, applicable to a rack, the rack comprising a first hole and a second hole, the slide rail kit comprising:
   a rail member; and
   a supporting bracket arranged on the rail member, the supporting bracket comprising a first mounting feature and a second mounting feature respectively configured to be mounted to a first predetermined portion of the first hole and a second predetermined portion of the second hole of the rack, to prevent the rail member from being moved longitudinally relative to the rack;
   wherein the second mounting feature comprises an elastic member and a mounting member, the mounting member is arranged on the elastic member, and the mounting member is configured to be mounted to the second predetermined portion of the rack;

wherein the mounting member comprises a head portion, a neck portion and a body portion, the neck portion is connected to the head portion and the body portion, the neck portion is an engaging slot, the elastic member has a key hole, and the key hole has an entrance portion and a blocking portion communicating with the entrance portion, the neck portion and the body portion of the mounting member are able to penetrate through the entrance portion, when the mounting member is moved to the blocking portion, an inner wall of the blocking portion is able to be engaged with the engaging slot of the mounting member.

9. The slide rail kit of claim 8, wherein the elastic member comprises a connecting portion, an operating portion and an elastic arm located between the connecting portion and the operating portion, the connecting portion is connected to the supporting bracket, and the mounting member is arranged on the elastic arm, such that the mounting member is able to be engaged with the second predetermined portion of the rack in response to an elastic force of the elastic arm.

10. A slide rail kit, applicable to a rack, the rack comprising at least one post, the at least one post having a first post side, a second post side opposite to the first post side, a first hole and a second hole, the first hole having a first predetermined portion, the second hole having a second predetermined portion, the slide rail kit comprising:

a rail member;

a supporting bracket arranged on the rail member;

a first mounting feature, arranged on the supporting bracket, wherein the first mounting feature has a first section, the first section extends transversally from the supporting bracket; and a second mounting feature, comprising:

an elastic member, elastically connected to the supporting bracket; and a mounting member, arranged on the elastic member;

wherein when the rail member is located on a first position relative to the at least one post of the rack, the first mounting feature penetrates through the first hole, and the mounting member of the second mounting feature abuts against the first post side of the at least one post, such that the elastic member is deformed elastically;

wherein when the rail member is located on a second position relative to the at least one post of the rack, the first section of the first mounting feature abuts against the first predetermined portion of the first hole, and the mounting member penetrates through the second hole in response to an elastic force of the elastic member, and the mounting member abuts against the second predetermined portion of the second hole;

wherein the elastic member has a key hole, and the key hole has an entrance portion and a blocking portion communicating with the entrance portion, at least a portion of the mounting member is able to penetrate through the entrance portion along a lateral direction, when the mounting member is moved to the blocking portion, an inner wall of the blocking portion is able to be engaged with the mounting member for allowing the mounting member and the elastic member to move along the lateral direction together by engagement of the inner wall of the blocking portion and the mounting member.

11. The slide rail kit of claim 10, wherein the first mounting feature further has a second section, the second section is connected to the first section, when the rail member is located at the second position relative to the at least one post of the rack, the second section of the first mounting feature abuts against the second post side of the at least one post, and the supporting bracket abuts against the first post side of the at least one post.

12. The slide rail kit of claim 10, wherein when the rail member is located at the second position relative to the at least one post of the rack, an upper wall and a lower wall of the first hole are respectively located above and below the first section of the first mounting feature, the upper wall and the lower wall are configured to prevent the supporting bracket from being moved up or down.

13. The slide rail kit of claim 10, wherein the elastic member comprises an operating portion and an elastic arm, the operating portion is connected to the elastic arm, the mounting member is arranged on the elastic arm, the operating portion is configured to be operated by a user, in order to detach the mounting member from the second hole of the at least one post.

14. The slide rail kit of claim 13, wherein the supporting bracket has a limiting portion, the elastic arm of the elastic member has a corresponding feature, and the corresponding feature to and the limiting portion block each other to prevent the elastic arm of the elastic member from being excessively moved along the lateral direction.

15. The slide rail kit of claim 10, wherein the mounting member comprises a head portion, a neck portion and a body portion, the neck portion is connected to the head portion and the body portion, a size of the head portion is greater than a size of the body portion, the size of the body portion is greater than a size of the neck portion, the neck portion is an engaging slot, the neck portion and the body portion of the mounting member are able to penetrate through the entrance portion, when the mounting member is moved to the blocking portion, the inner wall of the blocking portion is able to be engaged with the engaging slot of the mounting member.

* * * * *